United States Patent
Nabatame et al.

(10) Patent No.: US 7,511,338 B2
(45) Date of Patent: Mar. 31, 2009

(54) SEMICONDUCTOR DEVICE AND MANUFACTURING METHOD OF THE SAME

(75) Inventors: Toshihide Nabatame, Tokyo (JP); Masaru Kadoshima, Tokyo (JP); Hiroyuki Takaba, Tokyo (JP)

(73) Assignees: Renesas Technology Corp., Tokyo (JP); Tokyo Electron Limited, Tokyo (JP)

( * ) Notice: Subject to any disclaimer, the term of this patent is extended or adjusted under 35 U.S.C. 154(b) by 46 days.

(21) Appl. No.: 11/515,797

(22) Filed: Sep. 6, 2006

(65) Prior Publication Data

US 2007/0096157 A1 May 3, 2007

(30) Foreign Application Priority Data

Sep. 6, 2005 (JP) ............... 2005-257510

(51) Int. Cl.
*H01L 23/62* (2006.01)
(52) U.S. Cl. ............... 257/338; 257/357; 257/369
(58) Field of Classification Search ............... 257/288, 257/310, 350, 351, 368, 369, 371, 407, 410, 257/411, 412, E29.127, E29.128, E29.132; 438/199
See application file for complete search history.

(56) References Cited

U.S. PATENT DOCUMENTS 6,891,233 B2 * 5/2005 Lin et al. ............... 257/407

2004/0080001 A1 4/2004 Takeuchi

FOREIGN PATENT DOCUMENTS

| JP | 2000-252370 | 3/1999 |
|---|---|---|
| JP | 2003-273350 | 3/2002 |
| JP | 2004-165346 | 11/2002 |
| JP | 2004-165555 | 11/2002 |
| JP | 2004-356439 | 5/2003 |
| JP | 2005-51140 | 7/2003 |

OTHER PUBLICATIONS

Cartier, E. et al, "Role of Oxygen Vacancies in $V_{FB}/V_t$ stability of pFET metals on $HfO_2$", 2005 Symposium on VLSI Technology Digest of Technical Papers, IBM Semiconductor Research and Development Center (SRDC), Research Division, T.J. Watson Research Center, IBM Systems and Technology Division, pp. 230-231.
Japanese Office Action dated Aug. 5, 2008 regarding Japanese Patent Application No. 2005-257510 in Japanese.

* cited by examiner

*Primary Examiner*—M. Wilczewski
*Assistant Examiner*—Paul E Patton
(74) *Attorney, Agent, or Firm*—Reed Smith LLP; Juan Carlos A. Marquez, Esq.

(57) ABSTRACT

An object of the present invention is to simplify manufacturing process of an n channel MIS transistor and a p channel MIS transistor with gate electrodes formed of a metal material. For its achievement, gate electrodes of each of the n channel MIS transistor and the p channel MIS transistor are simultaneously formed by patterning ruthenium film deposited on a gate insulator. Next, by introducing oxygen into each of the gate electrodes, the gate electrodes are transformed into those having high work function. Thereafter, by selectively reducing the gate electrode of the n channel MIS transistor, it is transformed into a gate electrode having low work function.

6 Claims, 7 Drawing Sheets

SEMICONDUCTOR DEVICE AND MANUFACTURING METHOD OF THE SAME

CROSS-REFERENCE TO RELATED APPLICATION

The present application claims priority from Japanese Patent Application No. JP 2005-257510 filed on Sep. 6, 2005, the content of which is hereby incorporated by reference into this application.

TECHNICAL FIELD OF THE INVENTION

The present invention relates to semiconductor devices and manufacturing technologies thereof. More particularly, the present invention relates to a technology effectively applied to a semiconductor device having an n channel MIS transistor and a p channel MIS transistor with a gate electrode made of Ru (ruthenium).

BACKGROUND OF THE INVENTION

Recently, as MIS transistors which form semiconductor integrated circuits have been scaled, gate oxide films have become rapidly thinner. Consequently, influences of depletion in the gate electrode (polycrystalline silicon film) near the interfaces between the gate electrode and gate oxide film caused when gate voltage is applied to a gate electrode to turn on a MIS transistor become more and more apparent. As a result, apparent thickness of the gate oxide film becomes thicker, which makes it difficult to have sufficient ON current, and operation speed of the transistor is significantly reduced.

Also, when the gate oxide film becomes thinner, since a quantum effect called direct tunneling occurs, which makes electrons pass through the gate oxide, the leakage current is increased. Further, in a p channel MIS transistor, boron in its gate electrode (polycrystalline silicon film) diffuses into the substrate through its gate oxide and impurity concentration of channel region is increased. Therefore, the threshold voltage fluctuates.

For its solution, the replacement of the gate insulator material from the silicon oxide to an insulating material with a higher dielectric constant (high dielectric constant material) and the replacement of the gate electrode material from the polycrystalline silicon (or polycide) to metal have been examined.

This is because, when the high dielectric constant film is used to form the gate insulator, the actual physical thickness can be increased by a factor of "dielectric constant of a high dielectric constant film/dielectric constant of a silicon oxide film" while maintaining the same capacitance of the equivalent silicon oxide thickness (EOT), and as a result, the leakage current can be reduced. As a high dielectric constant material, various metal oxides such as hafnium oxide and zirconium oxide have been examined. In addition, when a material not containing polycrystalline silicon is used to form the gate electrode, the reduction of the ON current due to the depletion and the boron leakage from the gate electrode to the substrate can be prevented.

In the case where gate electrodes are formed of metal materials, different metal materials are used for each gate electrode of an n channel MIS transistor and a p channel MIS transistor and work functions thereof are optimized so as to control the threshold voltage.

For example, Japanese Patent Application Laid-Open Publication No. 2000-252370 (Patent Document 1) discloses a CMOS circuit in which a gate electrode of an n channel MIS transistor is formed of zirconium or hafnium and a gate electrode of a p channel MIS transistor is formed of platinum silicide, iridium silicide, cobalt, nickel, rhodium, palladium, rhenium or gold.

Also, Japanese Patent Application Laid-Open Publication No. 2004-165555 (Patent Document 2) discloses a CMOS circuit in which a gate electrode of an n channel MIS transistor is formed of any one of titanium, aluminum, tantalum, molybdenum, hafnium and niobium and a gate electrode of a p channel MIS transistor is formed of any one of tantalum nitride, ruthenium oxide, iridium, platinum, tungsten nitride and molybdenum nitride.

Also, Japanese Patent Application Laid-Open Publication No. 2004-165346 (Patent Document 3) discloses a CMOS circuit in which a gate electrode of an n channel MIS transistor is formed of aluminum and a gate electrode of a p channel MIS transistor is formed of compound metal obtained by introducing a material having a work function higher than that of aluminum (for example, cobalt, nickel, ruthenium, iridium, platinum and others) into aluminum.

2005 Symposium on VLSI Technology Digest of Technical Papers p 230-p 231 (Non-patent document 1) discloses a phenomenon in which the work function of a gate electrode is reduced when a MISFET with a gate electrode formed of a metal film such as ruthenium on a gate insulator formed of hafnium oxide is annealed in an reducing atmosphere. It is considered that the reduction of work function is caused because Hf—O bonds in the hafnium oxide film are broken through the reduction treatment and the oxygen vacancy concentration is increased.

SUMMARY OF THE INVENTION

However, the above mentioned prior arts for forming a gate electrode of an n channel MIS transistor and a gate electrode of a p channel MIS transistor with different metal materials from each other have drawbacks such as very complicated transistor manufacturing process and large increase in the number of processes.

An object of the present invention is to provide a technology capable of simplifying the manufacturing process of forming an n channel MIS transistor and a p channel MIS transistor having gate electrodes made of metal materials.

The above and other objects and novel characteristics of the present invention will be apparent from the description of this specification and the accompanying drawings.

The typical ones of the inventions disclosed in this application will be briefly described as follows.

The present invention is a manufacturing method of a semiconductor device, which comprises: an n channel MIS transistor with a first gate electrode formed in a first region on a main surface of a semiconductor substrate; and a p channel MIS transistor with a second gate electrode having work function higher than that of the first gate electrode formed in a second region on the main surface. The method comprises the steps of:

(a) forming a gate insulator on the main surface of the semiconductor substrate;

(b) after forming a metal film on the gate insulator, patterning the metal film to form a first gate electrode on the gate insulator in the first region and a second gate electrode on the gate insulator in the second region;

(c) annealing the semiconductor substrate in an atmosphere containing oxygen to introduce the oxygen into the first and second gate electrodes;

(d) after the step (c), covering the second gate electrode with a hydrogen barrier film; and (e) after the step (d), annealing the semiconductor substrate in an atmosphere containing hydrogen to make oxygen concentration in the first gate electrode lower than that in the second gate electrode.

According to the means described above, since the work function of the first gate electrode is made different from that of the second gate electrode by use of the difference in oxygen concentration in the metal film which forms the gate electrodes, it is possible to simplify the manufacturing process in comparison with the case where two types of metal materials having different work functions are used.

The effects obtained by typical aspects of the present invention will be briefly described below.

According to the present invention, it is possible to simplify a manufacturing process of an n channel MIS transistor and a p channel transistor with gate electrodes formed of a metal material.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

A method of manufacturing an n channel MIS transistor and a p channel MIS transistor according to the first embodiment will be described in order of processes with reference to FIG. 1 to FIG. 10.

Figure 1:
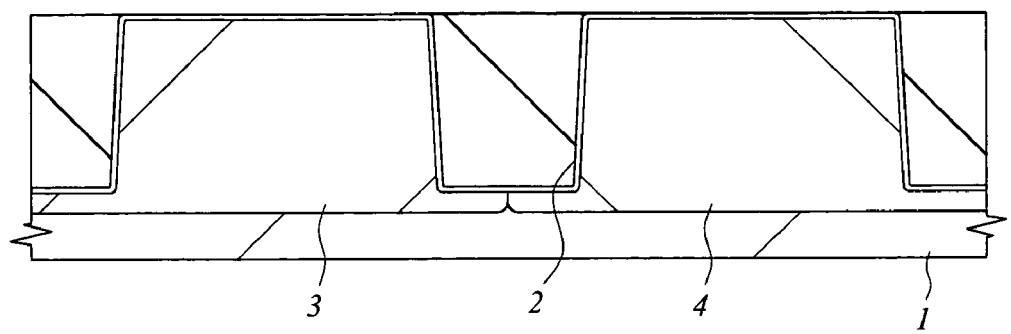
FIG. 1 is a cross-sectional view of a semiconductor substrate showing a manufacturing method of an n channel MIS transistor and a p channel MIS transistor according to an embodiment of the present invention.

First, as shown in FIG. 1, device isolation trenches 2 are formed through commonly known STI (Shallow Trench Isolation) technique in the main surface of a semiconductor substrate (hereinafter, referred to as substrate) 1 made of, for example, p-type single crystal silicon. Next, boron is ion-implanted into an n channel MIS transistor forming region (hereinafter, referred to as nMIS forming region, on the left side of the drawings), and phosphorus is ion-implanted into a p channel MIS transistor forming region (hereinafter, referred to as pMIS forming region, on the right side of the drawings) of the substrate 1. Subsequently, impurity ions for adjusting the threshold voltage of the MIS transistor are introduced into the nMIS forming region and the pMIS forming region of the substrate 1. Then, the substrate 1 is thermally treated to diffuse the impurities inside the substrate, thereby forming a p type well 3 and an n type well 4 in the main surface of the substrate 1.

Figure 2:
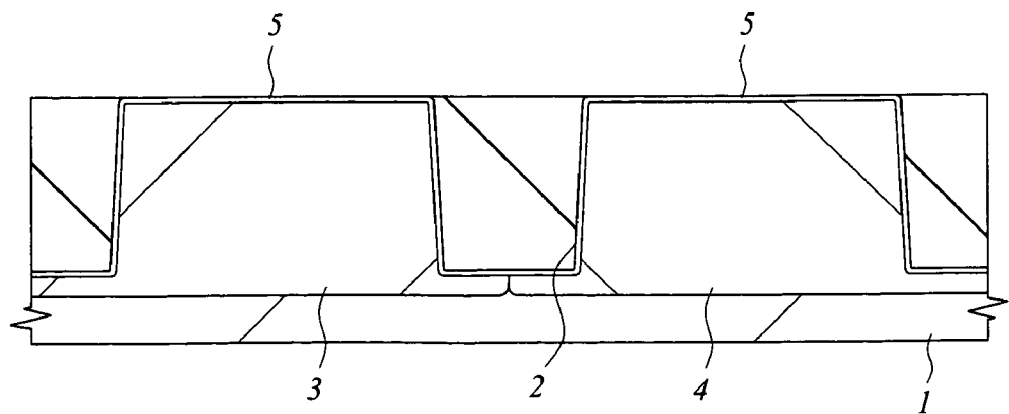
FIG. 2 is a cross-sectional view of the semiconductor substrate continued from FIG. 1, showing the manufacturing method of an n channel MIS transistor and a p channel MIS transistor.

Next, as shown in FIG. 2, a gate insulator 5 made of hafnium oxide is formed on each of the surfaces of the p type well 3 and the n type well 4. The hafnium oxide film is deposited through CVD or atomic layer deposition (ALD), and the thickness of the gate insulator 5 is about 1.5 to 4.0 nm. The gate insulator 5 can be formed of a high-k dielectric film other than hafnium oxide such as Hf—Si—O film, Hf—Si—O—N film, Hf—Al—O film, and Hf—Al—O—N film. Also, it can be formed of hafnium-based insulators obtained by introducing oxides such as tantalum oxide, niobium oxide, titanium oxide, zirconium oxide, lanthanum oxide, yttrium oxide, or the like into the hafnium-based oxide. Furthermore, the gate insulator 5 can be formed of a silicon oxide film or a silicon oxynitride film and a stacked film of above-listed hafnium-based insulators deposited on a silicon oxide film or a silicon oxynitride film.

Figure 3:
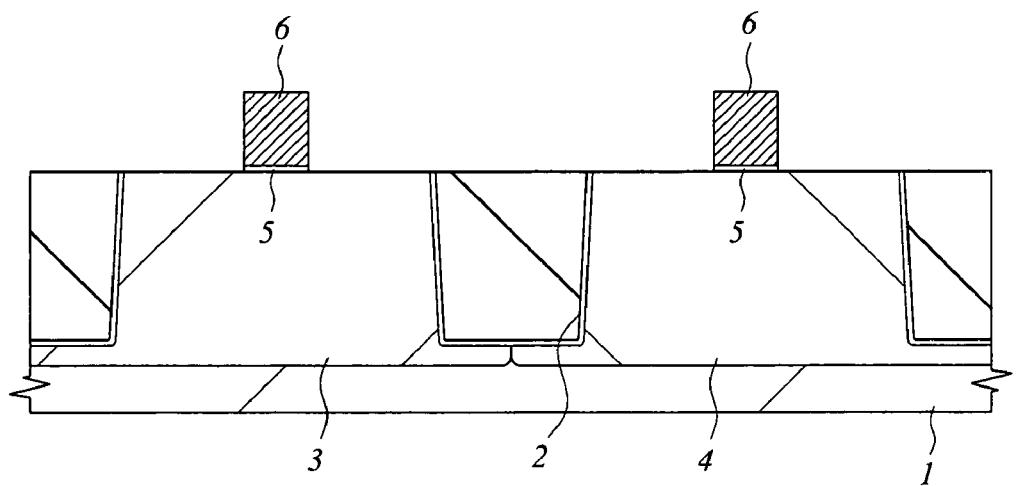
FIG. 3 is a cross-sectional view of the semiconductor substrate continued from FIG. 2, showing the manufacturing method of an n channel MIS transistor and a p channel MIS transistor.

Next, as shown in FIG. 3, after depositing a ruthenium film on the substrate 1 through sputtering, the ruthenium film is patterned through dry etching with using a photoresist film (not shown) as a mask. By this means, a gate electrode 6 made of the ruthenium film is formed on each of the gate insulator 5 on the p type well 3 and the gate insulator 5 on the n type well 4. A small amount of oxygen is contained in the ruthenium film which constitutes the gate electrodes 6.

The inventors of the present invention have measured the work function of the gate electrode 6 just after the gate electrode 6 is formed by depositing a ruthenium film with a thickness of 50 nm on the gate insulator 5 made of silicon oxide with a thickness of 8 nm and then patterning the ruthenium film. The work function of the gate electrode 6 is 4.9 eV.

Figure 4:
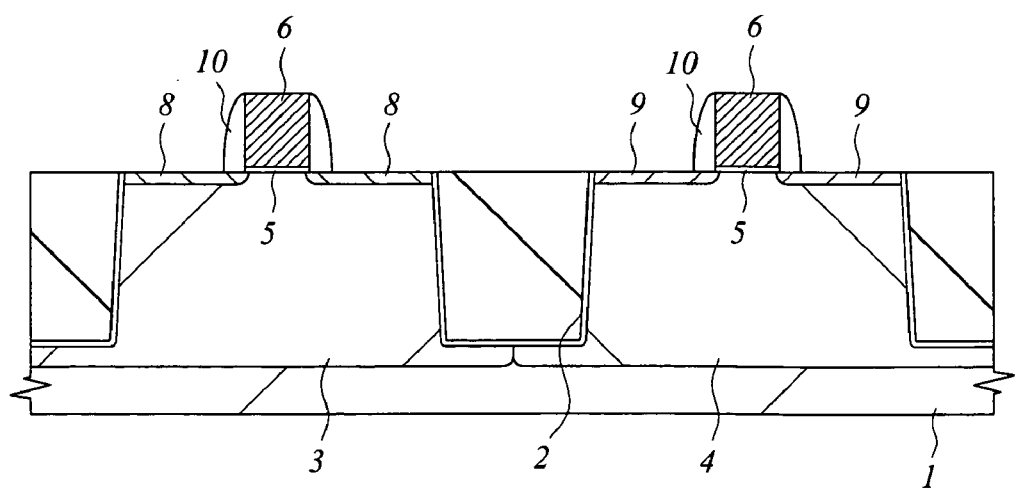
FIG. 4 is a cross-sectional view of the semiconductor substrate continued from FIG. 3, showing the manufacturing method of an n channel MIS transistor and a p channel MIS transistor.

Next, as shown in FIG. 4, phosphorus or arsenic is ion-implanted into the p type well 3 to form n⁻ type semiconductor regions 8, and boron is ion-implanted into the n type well 4 to form p⁻ type semiconductor regions 9. Thereafter, sidewall spacers 10 are formed on the sidewalls of the gate electrodes 6. The n⁻ type semiconductor regions 8 are formed so that the n channel MIS transistor has a LDD (Light Doped Drain) structure, and the p⁻ type semiconductor regions 9 are formed so that the p channel MIS transistor has a LDD (Light Doped Drain) structure. The sidewall spacers 10 are formed by depositing a silicon oxide film on the substrate 1 by CVD and then anisotropically etching the silicon oxide film.

Figure 5:
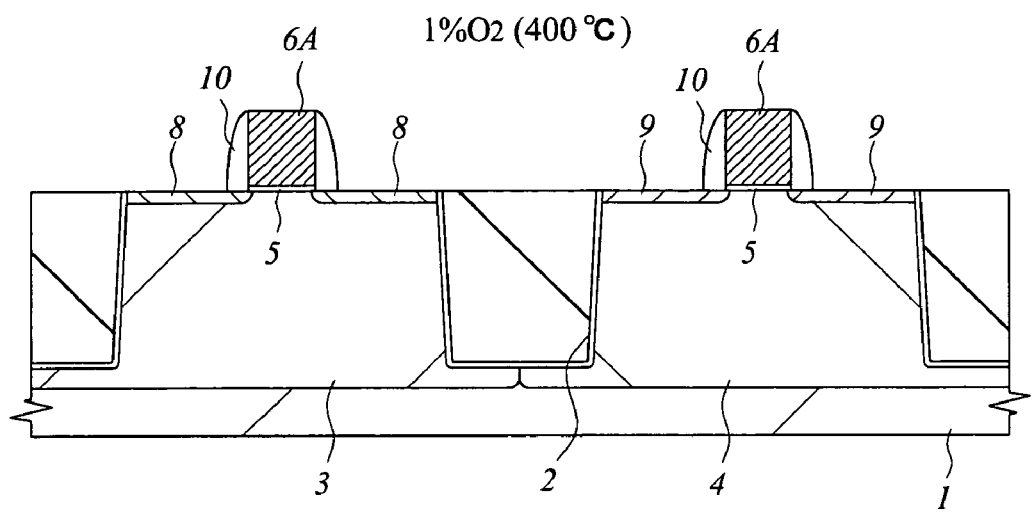
FIG. 5 is a cross-sectional view of the semiconductor substrate continued from FIG. 4, showing the manufacturing method of an n channel MIS transistor and a p channel MIS transistor.

Next, as shown in FIG. 5, the substrate 1 is annealed in high temperature atmosphere at about 400° C. containing 1% oxygen ($O_2$), thereby introducing oxygen into the gate electrodes 6 (ruthenium films). By means of this oxygen annealing treatment, gate electrodes 6A made of ruthenium films containing oxygen of $1 \times 10^{19}/cm^3$ or more can be obtained. The inventors of the present invention have formed the gate electrodes 6A by introducing oxygen into the gate electrodes 6 with the work function of 4.9 eV under the above-described conditions. The work function of these gate electrodes 6A is measured and it is 5.6 eV.

Figure 6:
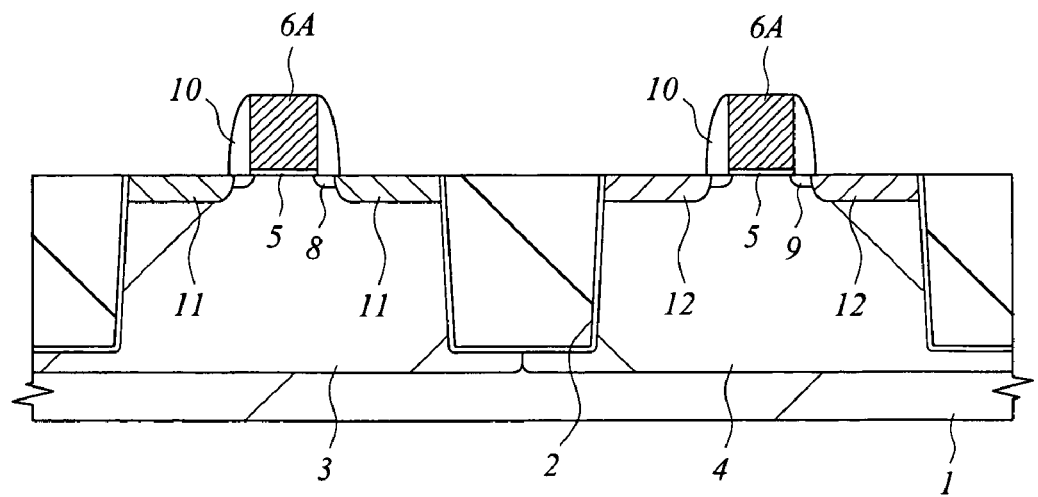
FIG. 6 is a cross-sectional view of the semiconductor substrate continued from FIG. 5, showing the manufacturing method of an n channel MIS transistor and a p channel MIS transistor.

Next, as shown in FIG. 6, phosphorus or arsenic is ion-implanted into the p type well 3 and boron is ion-implanted into the n type well 4. Thereafter, the substrate 1 is annealed to diffuse these impurities, thereby forming n⁺ type semiconductor regions 11 (source and drain) in the p type well 3 and p⁺ type semiconductor regions 12 (source and drain) in the n type well 4.

Further, the process of forming the gate electrodes 6A with high oxygen concentration by introducing oxygen into the gate electrodes 6 (ruthenium films) may be performed before the process of forming the sidewall spacers 10 on the sidewalls of the gate electrodes 6 or performed after the process of forming the n⁺ type semiconductor regions 11 and the p⁺ type semiconductor regions 12.

Figure 7:
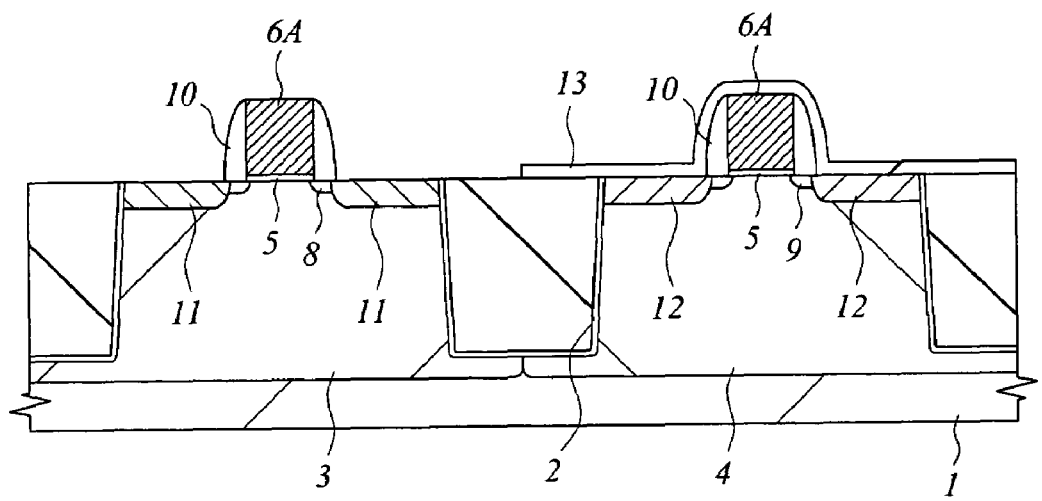
FIG. 7 is a cross-sectional view of the semiconductor substrate continued from FIG. 6, showing the manufacturing method of an n channel MIS transistor and a p channel MIS transistor.

Next, as shown in FIG. 7, the gate electrode 6A on the n type well 4 is covered with a hydrogen barrier film 13. The hydrogen barrier film 13 is a barrier film for preventing hydrogen ($H_2$) from being introduced into the gate electrode 6A (ruthenium film) of the p channel MIS transistor, and for example, alumina ($Al_2O_3$) film or the like is used. The hydrogen barrier film 13 is formed around the gate electrode 6A on the n type well 4 in the following manner. That is, after an alumina film of about 10 nm is deposited on the substrate 1 through sputtering, a photoresist film is deposited on the n type well 4, and then the alumina film on the p type well 3 is removed through dry etching.

Figure 8:
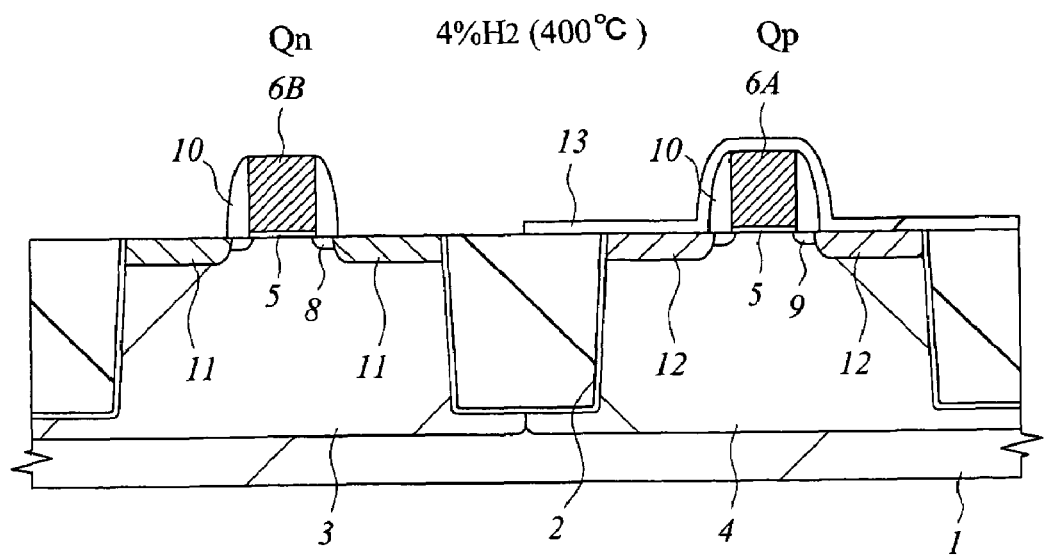
FIG. 8 is a cross-sectional view of the semiconductor substrate continued from FIG. 7, showing the manufacturing method of an n channel MIS transistor and a p channel MIS transistor.

Next, as shown in FIG. 8, hydrogen is introduced into the gate electrode 6A (ruthenium film) on the p type well 3 by annealing the substrate 1 in an atmosphere containing 4% hydrogen at high temperature of about 400° C. At this time, hydrogen is not introduced into the gate electrode 6A formed on the n type well 4 because it is covered with the hydrogen barrier film 13. Through the hydrogen annealing, oxygen in the gate electrode 6A formed on the p type well 3 is reduced by hydrogen and a gate electrode 6B made of a ruthenium film having low oxygen concentration (for example, $1 \times 10^{18}/cm^3$ or less) is formed. The inventors of the present invention have formed the gate electrode 6B by introducing hydrogen into the gate electrode 6A having work function of 5.6 eV under the above-described conditions. The work function of the gate electrode 6B is measured and it is 4.4 eV.

Through the process described above, an n channel MIS transistor (Qn) with the gate electrode 6B having low oxygen concentration and low work function (4.4 eV, for example) and a p channel MIS transistor (Qp) with the gate electrode 6A having high oxygen concentration and high work function (5.6 eV, for example) are completed.

Figure 9:
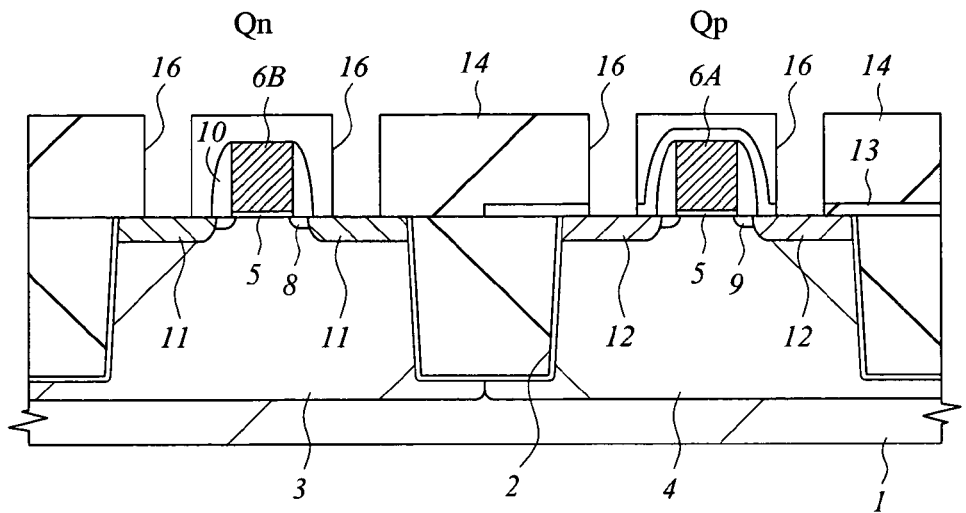
FIG. 9 is a cross-sectional view of the semiconductor substrate continued from FIG. 8, showing the manufacturing method of an n channel MIS transistor and a p channel MIS transistor.

Next, as shown in FIG. 9, a silicon oxide film 14 is deposited on the substrate 1 through CVD and the surface of the silicon oxide film 14 is planarized through chemical mechanical polishing. Thereafter, the silicon oxide film 14 and the hydrogen barrier films 13 are dry-etched with using a photoresist film as a mask, thereby forming contact holes 16 on the n⁺ type semiconductor regions 11 (source and drain) and on the p⁺ type semiconductor regions 12 (source and drain).

Figure 10:
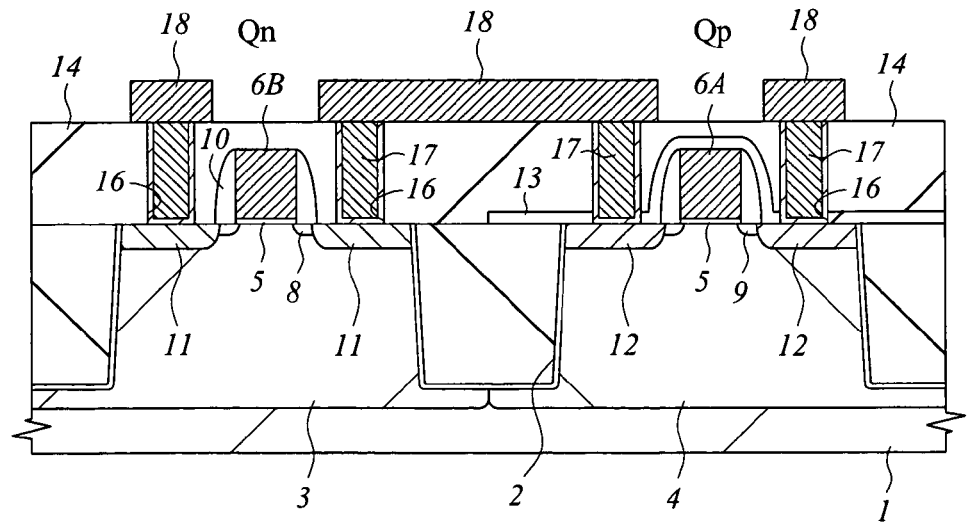
FIG. 10 is a cross-sectional view of the semiconductor substrate continued from FIG. 9, showing the manufacturing method of an n channel MIS transistor and a p channel MIS transistor.

Next, as shown in FIG. 10, plugs 17 are formed inside the contact holes 16 and then metal wires 18 are formed on the silicon oxide films 14. A titanium nitride (TiN) film and a tungsten (W) film are deposited on the silicon oxide films 14 including inside the contact holes 16 through sputtering. Subsequently, The TiN film and the W film are removed through chemical mechanical polishing, thereby forming the plugs 17. Further, a metal film such as a W film or an Al alloy film is deposited on the silicon oxide films 14 through sputtering and the metal film is patterned through dry etching with using a photoresist film (not shown) as a mask, thereby forming the metal wires 18.

As described above, in this embodiment, a ruthenium film deposited on the gate insulator 5 is patterned to simultaneously form the gate electrode 6 of the n channel MIS transistor (Qn) and the gate electrode 6 of the p channel MIS transistor (Qp). Then, oxygen is introduced into the gate electrode 6 of the n channel MIS transistor (Qn) and the gate electrode 6 of the p channel MIS transistor (Qp), thereby transforming these gate electrodes 6 into the gate electrodes 6A having high work function. Thereafter, the gate electrode 6A of the n channel MIS transistor (Qn) is selectively reduced through hydrogen annealing, thereby transforming it into the gate electrode 6B having low work function.

The reason why the work function of the gate electrodes 6 changes with the increase and decrease of oxygen concentration contained in the ruthenium film is that a part of Ru—Ru bonds change into Ru—O bonds as the oxygen concentration increases and Ru—O bonds change into Ru—Ru bonds as oxygen concentration decreases.

According to the first embodiment, two types of gate electrodes 6A and 6B with different work functions can be formed through small number of manufacturing processes in comparison with the case where two types of metal materials with different work functions are used.

Second Embodiment

A manufacturing method of an n channel MIS transistor (Qn) and a p channel transistor (Qp) according to the second embodiment will be described in order of processes with reference to FIG. 11 to FIG. 14.

Figure 11:
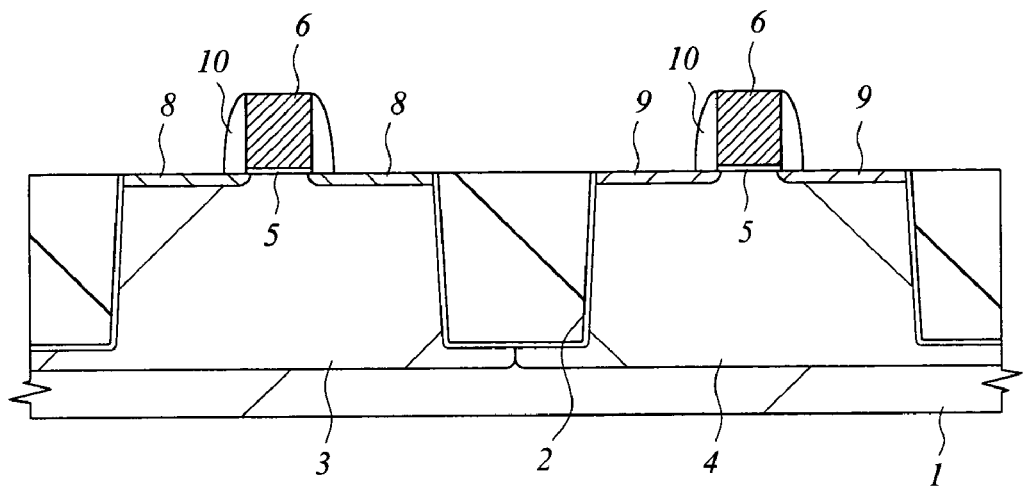
FIG. 11 is a cross-sectional view of a semiconductor substrate showing a manufacturing method of an n channel MIS transistor and a p channel MIS transistor according to another embodiment of the present invention.

First, as shown in FIG. 11, after forming device isolation trenches 2, a p type well 3, and an n type well 4 in the main surface of a substrate 1, a gate insulator 5 is formed on each surface of the p type well 3 and the n type well 4. Subsequently, after depositing a ruthenium film on the substrate 1 through sputtering, the ruthenium film is patterned, thereby forming gate electrodes 6 on the gate insulator 5 of the p type well 3 and the gate insulator of the n type well 4, respectively. A small amount of oxygen is contained in the ruthenium film which forms the gate electrodes 6 during its deposition.

Next, after forming n⁻ type semiconductor regions 8 in the p type well 3 and p⁻ type semiconductor regions 9 in the n type well 4, sidewall spacers 10 are formed on sidewalls of the gate electrodes 6. The processes thus far described are the same as these described in the first embodiment with reference to FIG. 1 to FIG. 4.

Figure 12:
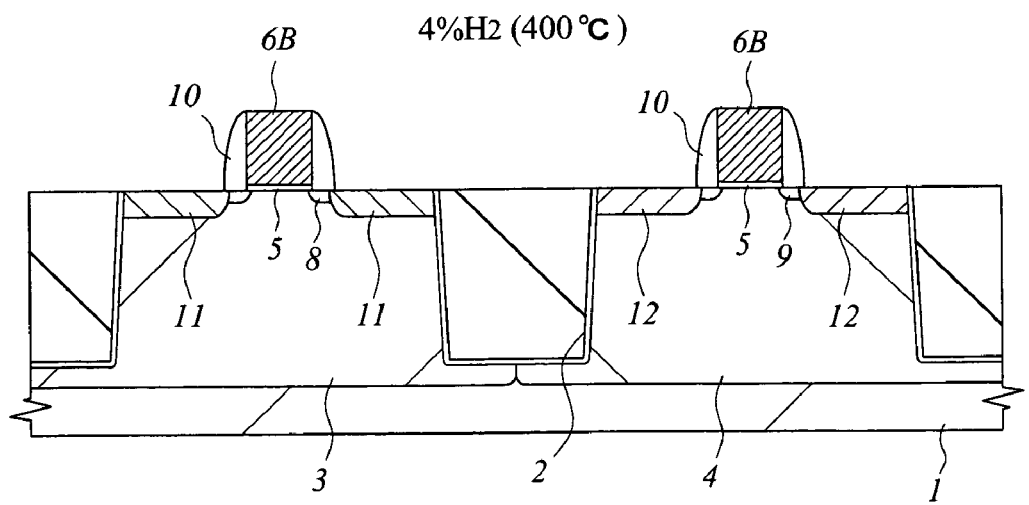
FIG. 12 is a cross-sectional view of the semiconductor substrate continued from FIG. 11, showing the manufacturing method of an n channel MIS transistor and a p channel MIS transistor.

Next, as shown in FIG. 12, phosphorus or arsenic are ion-implanted into the p type well 3 to form n⁺ type semiconductor regions (source and drain) 11, and boron is ion-implanted into the n type well 4 to form p⁺ type semiconductor regions (source and drain) 12. Subsequently, the substrate 1 is annealed in a high temperature atmosphere of about 400° C. containing 4% hydrogen. Through the hydrogen annealing, both of the gate electrode 6 formed on the p type well 3 and the gate electrode 6 formed on the n type well 4 are transformed into gate electrodes 6B formed of ruthenium films having low oxygen concentration (for example $1\times10^{18}/cm^3$ or lower). The work function of the gate electrodes 6B is, for example, 4.4 eV.

Further, the process of introducing hydrogen into the gate electrodes 6 to form the gate electrodes 6B with low oxygen concentration may be performed before the process of forming the sidewall spacers 10 on sidewalls of the gate electrodes 6.

Figure 13:
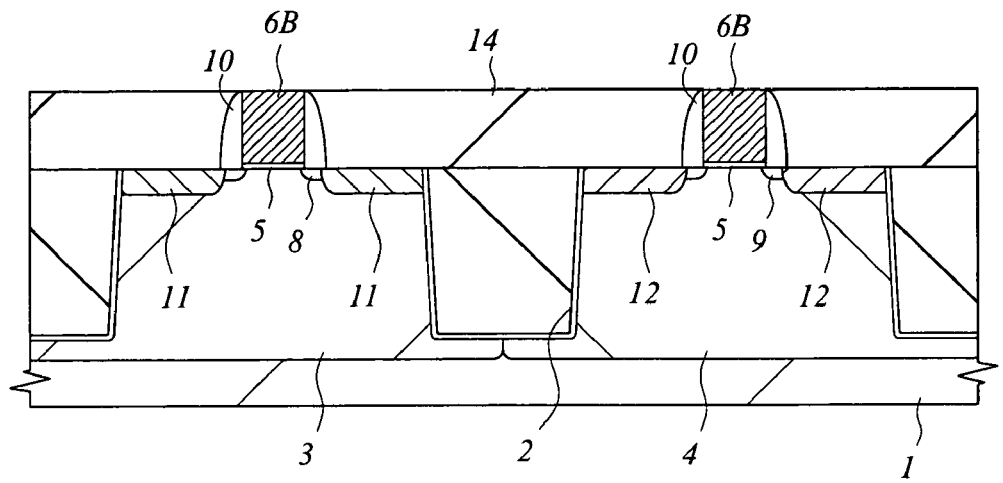
FIG. 13 is a cross-sectional view of the semiconductor substrate continued from FIG. 12, showing the manufacturing method of an n channel MIS transistor and a p channel MIS transistor.

Next, as shown in FIG. 13, a silicon oxide film 14 is deposited on the substrate 1 through CVD and the surface thereof is planarized through chemical mechanical polishing, thereby exposing the surface of the gate electrodes 6B. Note that, in order to reduce damages on the gate electrodes 6B during the above-described chemical mechanical polishing and following ion implantation, a stacked film of a ruthenium film and a barrier film (such as titanium nitride film and tantalum nitride (TaN) film) can be used to form the gate electrodes 6.

Figure 14:
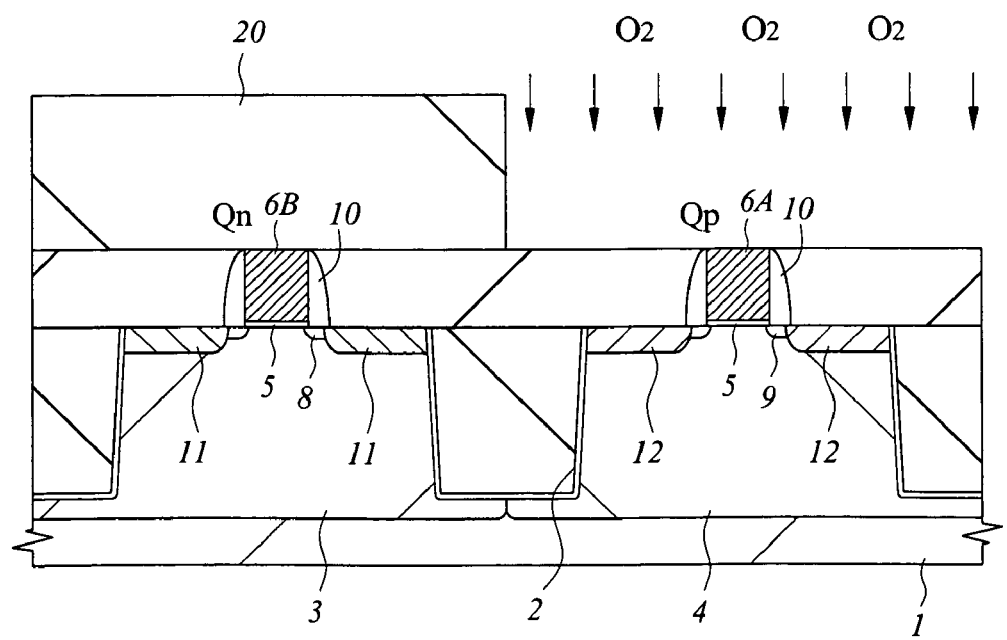
FIG. 14 is a cross-sectional view of the semiconductor substrate continued from FIG. 13, showing the manufacturing method of an n channel MIS transistor and a p channel MIS transistor.

Next, as shown in FIG. 14, after forming a photoresist film 20 on the silicon oxide film 14 in an nMIS forming region, oxygen is introduced into the gate electrode 6B on the n type well 4 through ion implantation. At this time, oxygen is not introduced into the gate electrode 6B on the p type well 3 because it is covered with the photoresist film 20. Through the ion implantation, a gate electrode 6A made of a ruthenium film having high oxygen concentration (for example, $1\times10^{19}/cm^3$ or higher) is formed on the n type well 4.

Through the processes thus far described, an n channel MIS transistor (Qn) with the gate electrode 6B having low oxygen concentration and low work function (4.4 eV, for example) and a p channel MIS transistor (Qp) with the gate electrode 6A having high oxygen concentration and high work function (5.6 eV, for example) are completed.

As described above, in this embodiment, a ruthenium film deposited on the gate insulator 5 is patterned to simultaneously form the gate electrode 6 of the n channel MIS transistor (Qn) and the gate electrode 6 of the p channel MIS transistor (Qp). Then, hydrogen is introduced into the gate electrode 6 of the n channel MIS transistor (Qn) and the gate electrode 6 of the p channel MIS transistor (Qp), thereby transforming these gate electrodes 6 into the gate electrodes 6B having low work function. Thereafter, the gate electrode 6B of the p channel MIS transistor (Qp) is transformed into the gate electrode 6A having high work function by ion-implanting oxygen into the gate electrode 6B of the p channel MIS transistor (Qp).

According to the second embodiment, similar to the first embodiment, two types of gate electrodes 6A and 6B with different work functions can be formed through small number of manufacturing processes in comparison with the case where two types of metal materials with different work functions are used.

Also, according to the second embodiment, the gate electrode 6A having high work function is formed by the oxygen ion implantation instead of the annealing in oxygen atmosphere. Since the ion implantation can control the oxygen concentration in the gate electrode 6A with higher accuracy than the annealing, the work function of the gate electrode 6A can be controlled with higher accuracy.

In the foregoing, the invention made by the inventors of the present invention has been concretely described based on the embodiments. However, it is needless to say that the present invention is not limited to the foregoing embodiments and various modifications and alterations can be made within the scope of the present invention.

In the embodiments described above, ruthenium is used for the gate electrode material. However, it is not limited to this, and other metal such as iridium (Ir) may be used as long as the work function changes in accordance with the oxygen concentration contained in the film.

The present invention can be applied to semiconductor devices which have an n channel MIS transistor and a p channel MIS transistor with metal gate electrodes.

What is claimed is:

1. A semiconductor device comprising:
   an n channel MIS transistor with a first gate electrode formed in a first region on a main surface of a semiconductor substrate; and
   a p channel MIS transistor with a second gate electrode having a work function higher than a work function of said first gate electrode formed in a second region on said main surface,
   wherein said first and second gate electrodes are formed of the same metal,
   wherein oxygen concentration in said second gate electrode is higher than oxygen concentration in said first gate electrode, and
   wherein a hydrogen barrier film is formed over said second gate electrode and is not formed over said first gate electrode.

2. The semiconductor device according to claim 1, wherein said metal is ruthenium.

3. The semiconductor device according to claim 2, wherein oxygen concentration in ruthenium which forms said first gate electrode is equal to or lower than $1\times10^{18}/cm^3$ and oxygen concentration in ruthenium which forms said second gate electrode is equal to or higher than $1\times10^{19}/cm^3$.

4. The semiconductor device according to claim 1, wherein said metal is iridium.

5. The semiconductor device according to claim 1, wherein gate insulators below said first and second gate electrodes mainly contain at least one of hafnium oxides selected from a group of Hf—O, Hf—Si—O, Hf—Si—O—N, Hf—Al—O and Hf—Al—O—N.

6. The semiconductor device according to claim 1, wherein said hydrogen barrier film is formed of an alumina film.

* * * * *